United States Patent
King

[11] Patent Number: 5,814,180
[45] Date of Patent: *Sep. 29, 1998

[54] LOW TEMPERATURE METHOD FOR MOUNTING ELECTRICAL COMPONENTS

[75] Inventor: David Robert King, Elkton, Md.

[73] Assignee: W. L. Gore & Associates, Inc., Newark, Del.

[ * ] Notice: The term of this patent shall not extend beyond the expiration date of Pat. No. 5,604,026.

[21] Appl. No.: 689,448

[22] Filed: Aug. 9, 1996

Related U.S. Application Data

[63] Continuation-in-part of Ser. No. 465,021, Jun. 5, 1995, Pat. No. 5,604,026, which is a continuation-in-part of Ser. No. 147,196, Nov. 3, 1993, abandoned.

[51] Int. Cl.[6] .................................. C09J 5/08; C09J 9/02
[52] U.S. Cl. .......................... 156/333; 156/326; 156/327; 156/325; 428/317.1; 428/317.3; 428/317.5; 428/317.7; 428/343; 428/344; 428/354
[58] Field of Search ................................. 156/306.3, 325, 156/326, 327, 333; 428/317.1, 317.3, 317.5, 317.7, 343, 344, 354

[56] References Cited

U.S. PATENT DOCUMENTS

| | | | |
|---|---|---|---|
| 3,953,566 | 4/1976 | Gore | 264/288 |
| 4,110,392 | 8/1978 | Yamazaki | 264/127 |
| 4,187,390 | 2/1980 | Gore | 174/102 |
| 4,385,102 | 5/1983 | Fitzky et al. | 429/111 |
| 4,557,957 | 12/1985 | Manniso | 428/36 |
| 4,857,668 | 8/1989 | Buonanno | 174/35 |
| 4,912,594 | 3/1990 | Bannink, Jr. et al. | 361/218 |
| 5,202,536 | 4/1993 | Buonanno | 174/35 |
| 5,269,810 | 12/1993 | Hull et al. | 607/129 |
| 5,512,360 | 4/1996 | King | 428/304.4 |
| 5,604,026 | 2/1997 | King | 428/317.1 |

FOREIGN PATENT DOCUMENTS 0 560 072  2/1993  European Pat. Off. .

OTHER PUBLICATIONS

Patent Abstracts of Japan vol. 017, No. 009 (E–1303) 8 Jan. 1993 & JP, A, 04 242 010 (Sony Chem Corp) 28, Aug. 1992.

*Primary Examiner*—Marion E. McCamish
*Assistant Examiner*—Elizabeth M. Cole
*Attorney, Agent, or Firm*—Victor M. Genco, Jr.

[57] ABSTRACT

A method for low temperature attachment of components is provided which uses an electrically conductive adhesive. The electrically conductive adhesive may be defined by a substrate having numerous passageways through the substrate. The passageways are defined by a plurality of walls of the material making up the substrate. The walls are covered with a layer of conductive metal. The passageways at the outer surfaces are filled with a non-conductive pressure sensitive adhesive resin.

1 Claim, 1 Drawing Sheet

LOW TEMPERATURE METHOD FOR MOUNTING ELECTRICAL COMPONENTS

CROSS-REFERENCE TO RELATED APPLICATIONS

This application is a continuation-in-part of application Ser. No. 08/465,021, filed Jun. 5, 1995, now U.S. Pat. No. 5,604,026, which is a continuation-in-part of application Ser. No. 08/147,196, filed Nov. 3, 1993 (abandoned).

BACKGROUND OF THE INVENTION

Heat sensitive components have been defined as components that are adversely effected by elevated temperatures. More particularly, some electronic components, such as piezoelectric devices and oscillators for example, will degrade when exposed to temperatures above 90° C. Additionally, certain electronic modules may use low temperature plastic components or adhesives inside of a sealed enclosure, such as transmit and receive modules which are employed in phased array antennas. It is often necessary to electrically and mechanically attach such electronic components and modules to a ground plate at less than 90° C. to prevent degrading their performance.

In the past, heat sensitive components have been attached with mechanical clamps, or electrically conductive adhesives. As may be appreciated by one skilled in the art, in electronic devices, typically there is insufficient room to clamp electronic components, or at least one of the components to be attached is too fragile to withstand the requisite clamping force to provide an effective electrical ground between the components being electrically and mechanically attached.

With low temperature bonding adhesives, there are also many shortcomings which detract from their usefulness for electrically attaching electronic components or modules to a desired substrate. More particularly, when high electrical conductivity is required, conventional low temperature adhesives have been employed which comprise silver particles mixed with an adhesive system. Several adhesive systems exist that will bond at low temperatures (i.e. under 90° C.). From the standpoint of reducing any possibility of degrading the component to be attached, and minimizing bonding stress caused by mismatched coefficient of thermal expansions (CTEs) between the components being attached, an ideal adhesive would bond at room temperature (i.e. about 25° C.). Currently there are several types of adhesives that will bond at room temperature. One type is a two component system that requires mixing just prior to application. A shortcoming of such an adhesive is that the material is not available in a film or sheet form, which can simplify assembly. Additionally, the mixing of the two parts, application of the adhesive, and bonding of the parts must happen within a short interval of time which is often impractical.

Single system component adhesives exist that eliminate mixing. However, these systems require a moisture or anaerobic cure. Such curing mechanisms generally require the parts being bonded to be held together for extended periods of time until the cure is complete, which can take up to 24 hours. Also, ultra-violet (UV) curing systems exist, but such a curing system is not useable when bonding components which are sensitive to, or which degrade when exposed to UV light. Additionally, most components are impervious to UV light, thereby precluding a proper cure of the adhesive system.

Pressure sensitive adhesives exist that are filled with metal particles. However, to date, particle filled pressure sensitive adhesives have not provided sufficient electrical conductivity to meet the needs of high performance electrical applications. Additionally, a predetermined thickness of adhesive material is often employed to take up tolerance mismatches of the components being attached. However, making pressure sensitive adhesives thicker has generally resulted in lessened electrical performance and more difficulty in handling during the processing and manufacturing thereof.

The foregoing illustrates limitations known to exist in existing methods for low temperature electrical bonding of components. Thus, it is apparent that it would be advantageous to provide a method directed to overcoming one or more of the limitations set forth above. Accordingly, a suitable alternative is provided including features more fully disclosed hereinafter.

SUMMARY OF THE INVENTION

The present invention advances the art of low temperature electrical bonding beyond which is known to date. In one aspect of the present invention, a low temperature method is provided for mounting electrical components. The method of the present invention comprises the steps of:

providing an electrically conductive pressure sensitive adhesive material which is effective to adhesively bond to an object of interest at about 25° C., said electrically conductive adhesive defined by a substantially planar substrate having an internal matrix defined by numerous open passageways having walls, said walls having disposed thereon a layer of conductive metal, said open passageways being filled with a pressure sensitive adhesive resin, wherein the electrically conductive pressure sensitive adhesive material permits an electric current to flow from a first surface, through the planar substrate, to a second surface thereof;

providing a predetermined electronic component;

providing a conductive mounting surface;

affixing the first surface of the electrically conductive pressure sensitive adhesive to the electronic component; and affixing said second surface of the electrically conductive pressure sensitive adhesive to the conductive surface thereby mounting the electronic component in electrical communication with the conductive mounting surface.

It is a purpose of the present invention to provide an adhesive system that allows for components to be quickly and easily attached, that provides good electrical grounding, that does not promote shorting to adjacent components, and that allows for simple rework of electrical components.

BRIEF DESCRIPTION OF THE DRAWING

The foregoing summary, as well as the following detailed description of a preferred embodiment of the present invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
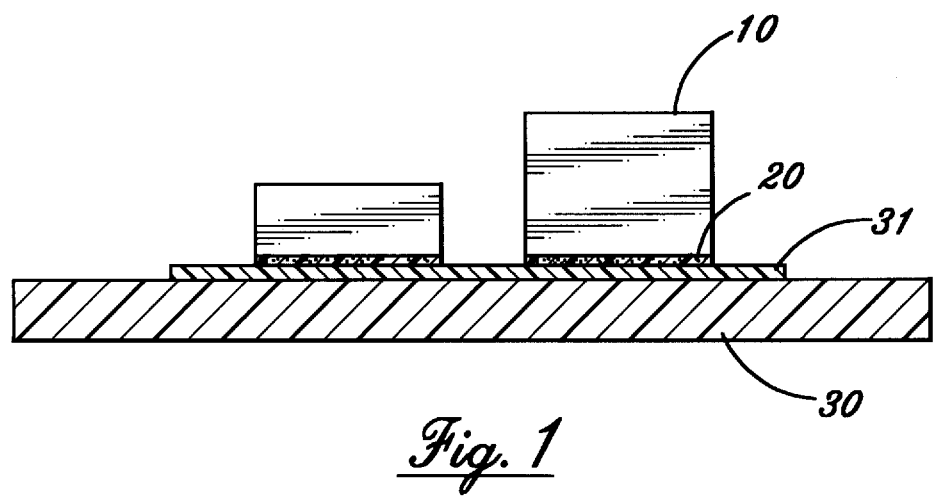
FIG. 1 is a sectional view of an electronic component attached to a printed wiring board (PWB) in accordance with the method of the present invention.

As best seen by reference to FIG. 1, an electronic component, generally illustrated at 10, is adhesively electrically mounted to an electrical ground 31 of a substrate 30, such as a printed wiring board (PWB) for example, using a pressure sensitive adhesive 20.

As the term is used herein, "pressure sensitive adhesive" shall mean, a non-curing adhesive system that will adhere to a surface upon the application of a minimal pressure and that does not require elevated temperatures or time to bond to an object of interest.

Figure 2:
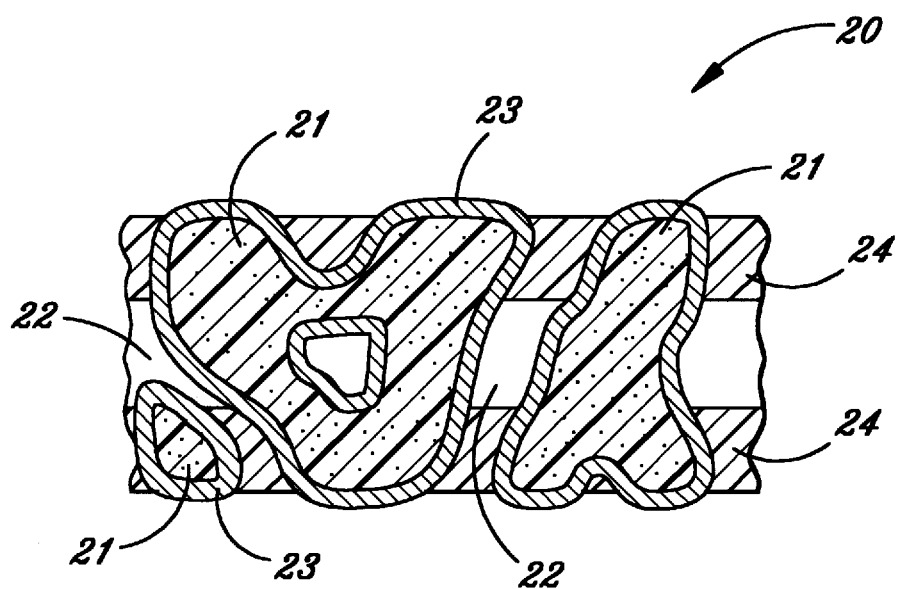
FIG. 2 is an enlarged partial sectional illustration of one embodiment of a conductive pressure sensitive adhesive in accordance with the teachings of the present invention.

The present invention is directed to a low temperature method for mounting electrical components. FIG. 2 illustrates an enlarged partial sectional view of a pressure sensitive adhesive material which may be employed in the method of the present invention.

As the term is used herein, "low temperature" shall mean, less than about 90° C. A preferred low temperature is about 25° C.

In FIG. 2, a conductive pressure sensitive adhesive material 20 comprises a substrate 21 having an internal matrix defined by interconnecting passageways 22 extending from one side of the substrate 21 to the other. The substrate may be a fabric, a porous membrane, a foam, or the like. Preferably, the substrate is resilient and compressible to provide compliance. If a fabric is employed, the fabric may be any suitable woven, nonwoven or knit material, provided it has the requisite internal matrix and passageways. Representative substrates may include, but are not limited to, polyamide, porous polytetrafluoroethylene (PTFE), polyester, polyurethane or polyimide, for example. An especially preferred substrate, for its strength, compressibility, temperature resistance and chemical inertness is porous PTFE.

As the term is used herein porous polytetrafluoroethylene (PTFE) shall mean a membrane which may be prepared by any number of known processes, for example, by stretching or drawing processes, by papermaking processes, by processes in which filler materials are incorporated with the PTFE resin and which are subsequently removed to leave a porous structure, or by powder sintering processes. Preferably, the porous polytetrafluoroethylene membrane is porous expanded polytetrafluoroethylene membrane having a microstructure of interconnected nodes and fibrils, as described in U.S. Pat. Nos. 3,953,566; 4,187,390; and 4,110,392, which are incorporated herein by reference, and which fully describe the preferred material and processes for making them.

The substrate 21 will generally have a thickness ranging from 0.003 inches to about 0.100 inches, and generally will take the form of a sheet, although the shape can be matched to the components that are being bonded together. The walls of the passageways 22 have adhered to them a conductive metal 23 which can be formed on the walls by an electroless plating procedure. Representative conductive metals include copper, nickel, silver, gold, and the like. The metal coating, or plating, does not fill the passageway volume but only covers the material defining the passageways. One suitable conductive plated substrate for use with the present invention is polymeric fabric, more particularly a polyester fabric, which is available under the tradename FLECTRON, from the Monsanto Company. Another suitable conductive plated substrate may be a porous metal-plated PTFE which may be made in accordance with the teachings of U.S. Pat. No. 4,557,957, which is incorporated herein by reference.

Once the conductive metal material is in place on the walls of the passageways, the remaining passageway volume is filled with a nonconductive pressure sensitive adhesive 24 at the outer surfaces where the material will bond to parts. Suitable pressure sensitive adhesives include acrylic resin, polyester resin, silicone resin, rubber resin, or the like. The adhesive is conveniently imbibed into the passageways along the surface by forcing a thin coating of the pressure sensitive resin into the surfaces of the substrate using elevated temperatures and pressures. For example, a 0.001 inch (25 micrometer) thick acrylic coating can be forced into the surface of the metalized ePTFE substrate as mentioned above at 90° C. and 25 PSI.

The electronic component 10 may be attached to the PWB 30, at a temperature of about 25° C., by placing the conductive pressure sensitive adhesive 20 between the component 10 and the PWB 30, and applying minimal pressure to the conductive adhesive to connect the adhesive to both the component and a surface of the ground 31.

Without intending to limit the scope of the present invention, the apparatus and method of production of the present invention may be better understood by referring to the following examples:

EXAMPLE 1

A conductive pressure sensitive adhesive film was produced using a metallized, porous ePTFE conductive matrix with an acrylic pressure sensitive adhesive resin imbibed into both surfaces of the ePTFE conductive matrix. The produced conductive pressure sensitive adhesive had a release liner on both sides to facilitate handling. The releaser liner was removed from one side of a one square inch piece of the conductive pressure sensitive adhesive and the exposed surface was placed against a 0.030 inch thick copper base. The other side of the release liner was removed, and a 0.005 inch thick copper strip was placed on top of the adhesive with hand pressure. The electrical resistance through the adhesive was measured at 2.6 mΩ when measured with a four wire micro-ohmmeter from the edge of the copper strip to the edge of the copper base. The copper strip was then pulled at 90°. An average peel strength of 8 pounds per linear inch was measured.

EXAMPLE 2

A conductive pressure sensitive adhesive film was produced using a metallized, porous polyester conductive matrix with a rubber pressure sensitive adhesive resin imbibed into both surfaces. The produced conductive pressure sensitive adhesive had a release liner on both sides to facilitate handling. The releaser liner was removed from one side of a one square inch piece of conductive adhesive and the exposed surface was placed against a 0.030 inch thick copper base. The other side of the release liner was removed, and a 0.005 inch thick copper strip was placed on top of the adhesive with hand pressure. The electrical resistance through the adhesive was measured at 80 mΩ when measured with a four wire micro-ohmmeter from the edge of the copper strip to the edge of the copper base. The copper strip was then pulled at 90°. An average peel strength of 4 pounds per linear inch was measured.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. A low temperature method for mounting an electronic component, said method comprising the following steps:

providing an electrically conductive pressure sensitive adhesive material which is effective to adhesively bond to an object of interest at a temperature of less than about 90° C., said electrically conductive adhesive defined by a substantially planar substrate having first and second outer surfaces and numerous open passageways through the substrate defined by a plurality of walls, said walls having disposed thereon a layer of conductive metal, said open passageways being filled with a pressure sensitive adhesive resin at passageway locations near the first and second surfaces, wherein the electrically conductive pressure sensitive adhesive material permits an electric current to flow from a first surface, through the planar substrate, to a second surface thereof;

providing a predetermined electronic component;

providing a conductive mounting surface;

affixing the first surface of the electrically conductive pressure sensitive adhesive to the electronic component; and affixing said second surface of the electrically conductive pressure sensitive adhesive to the conductive surface thereby mounting the electronic component in electrical communication with the conductive mounting surface.

* * * * *